(12) United States Patent
Fanton et al.

(10) Patent No.: US 12,227,302 B2
(45) Date of Patent: Feb. 18, 2025

(54) DEVICE FOR DETECTING IMPACTS, ASSOCIATED DETECTION SYSTEM AND AIRCRAFT EQUIPPED WITH SUCH A SYSTEM

(71) Applicants: SAFRAN ELECTRICAL & POWER, Blagnac (FR); SAFRAN ELECTRONICS & DEFENSE, Boulogne-Billancourt (FR)

(72) Inventors: Nicolas Fanton, Moissy-Cramayel (FR); Serge Thierry Roques, Moissy-Cramayel (FR); Emmanuel Couturier, Moissy-Cramayel (FR); Nicolas Paris, Moissy-Cramayel (FR)

(73) Assignees: SAFRAN ELECTRICAL & POWER, Blagnac (FR); SAFRAN ELECTRONICS & DEFENSE, Boulogne-Billancourt (FR)

( * ) Notice: Subject to any disclaimer, the term of this patent is extended or adjusted under 35 U.S.C. 154(b) by 256 days.

(21) Appl. No.: 17/783,509

(22) PCT Filed: Dec. 8, 2020

(86) PCT No.: PCT/FR2020/052332
§ 371 (c)(1),
(2) Date: Jun. 8, 2022

(87) PCT Pub. No.: WO2021/116589
PCT Pub. Date: Jun. 17, 2021

(65) Prior Publication Data
US 2023/0348095 A1    Nov. 2, 2023

(30) Foreign Application Priority Data
Dec. 11, 2019 (FR) ........................ 1914168

(51) Int. Cl.
*B64D 45/00*    (2006.01)
*B64F 5/60*    (2017.01)
(Continued)

(52) U.S. Cl.
CPC ............... *B64D 45/00* (2013.01); *B64F 5/60* (2017.01); *H02J 50/20* (2016.02); *H10N 10/17* (2023.02);
(Continued)

(58) Field of Classification Search
CPC ... B64D 45/00; B64D 2045/0085; B64F 5/60; H02J 50/20; H02J 2310/44; H02J 7/34;
(Continued)

(56) References Cited

U.S. PATENT DOCUMENTS 6,014,896 A * 1/2000 Schoess ................. G01N 29/42
73/583
6,748,791 B1 * 6/2004 Georgeson ......... G01N 29/4427
73/12.06
(Continued)

FOREIGN PATENT DOCUMENTS

EP    2 081 156 A2    7/2009
FR    3073500 A1 *    5/2019    ............... B64F 5/60
(Continued)

OTHER PUBLICATIONS

International Search Report as issued in International Patent Application No. PCT/FR2020/052332, dated Mar. 29, 2021.

*Primary Examiner* — Marrit Eyassu
(74) *Attorney, Agent, or Firm* — Pillsbury Winthrop Shaw Pittman LLP

(57) ABSTRACT

An autonomous impact detection device includes at least one impact detector; at least one wireless transmission device configured to transmit the information collected by the impact detector; at least one energy storage device (Continued)

configured to supply the impact detector and the wireless transmission device with energy; at least one Seebeck module configured to supply the storage device with energy when a temperature gradient is applied thereto; the wireless transmission device being configured to supply the storage device with energy when the temperature gradient to which the Seebeck module is exposed is not sufficient.

8 Claims, 5 Drawing Sheets

(51) Int. Cl.
    *G08C 17/02*     (2006.01)
    *H02J 50/20*     (2016.01)
    *H10N 10/17*     (2023.01)

(52) U.S. Cl.
    CPC ...... *B64D 2045/0085* (2013.01); *G08C 17/02* (2013.01)

(58) Field of Classification Search
    CPC ......... H02J 1/084; H10N 10/17; H10N 10/10; G08C 17/02
    USPC ...................................................... 73/866.1
    See application file for complete search history.

(56) References Cited

U.S. PATENT DOCUMENTS

| | | | |
|---|---|---|---|
| 8,886,388 B2* | 11/2014 | Moser | G01M 5/0083 |
| | | | 701/34.2 |
| 2011/0162451 A1 | 7/2011 | Petelenz et al. | |
| 2016/0025590 A1* | 1/2016 | Munger | G01M 7/025 |
| | | | 73/658 |

FOREIGN PATENT DOCUMENTS

| | | | | |
|---|---|---|---|---|
| WO | WO-2009062635 A1 * | 5/2009 | ............... | B64C 1/12 |
| WO | WO 2011/109533 A2 | 9/2011 | | |
| WO | WO 2019/090426 A1 | 5/2019 | | |

* cited by examiner

[Fig. 1]
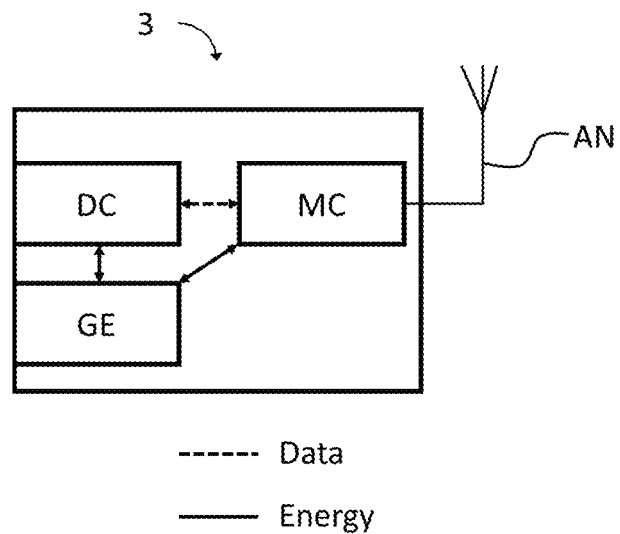
------ Data
―――― Energy
[Fig. 2]
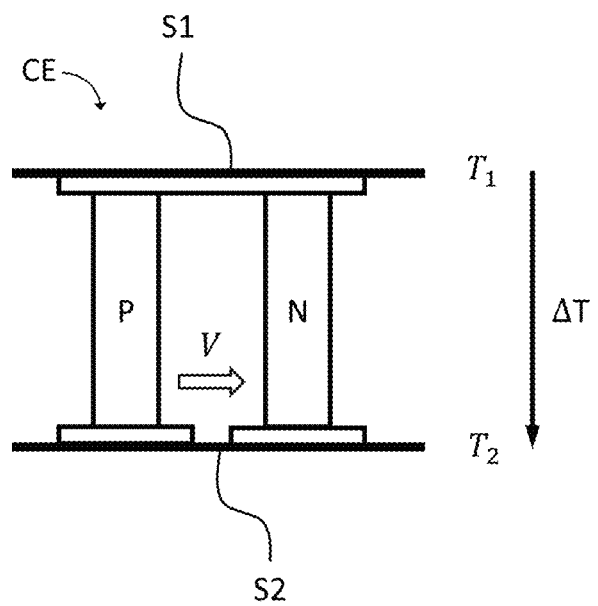

[Fig. 3]
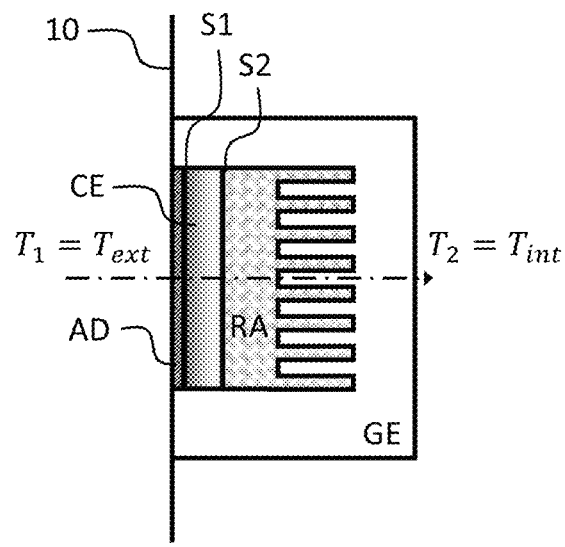
[Fig. 4]
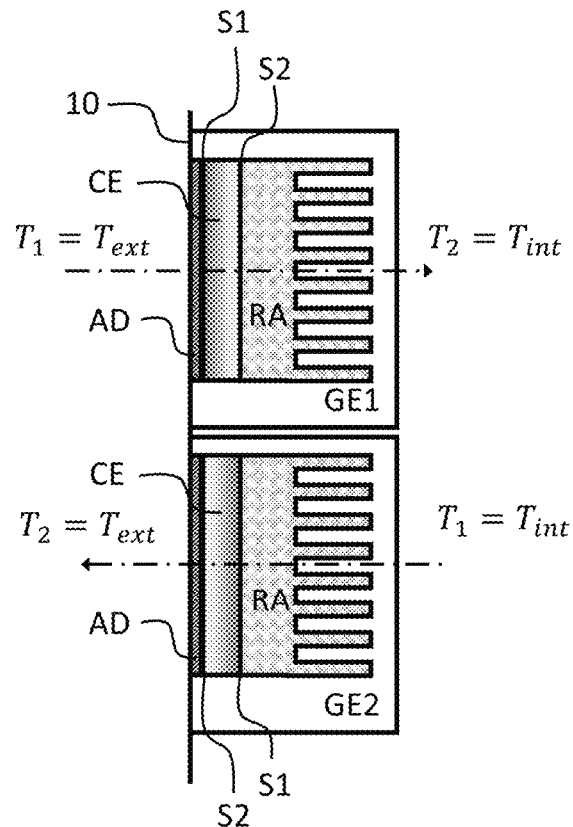

[Fig. 5]
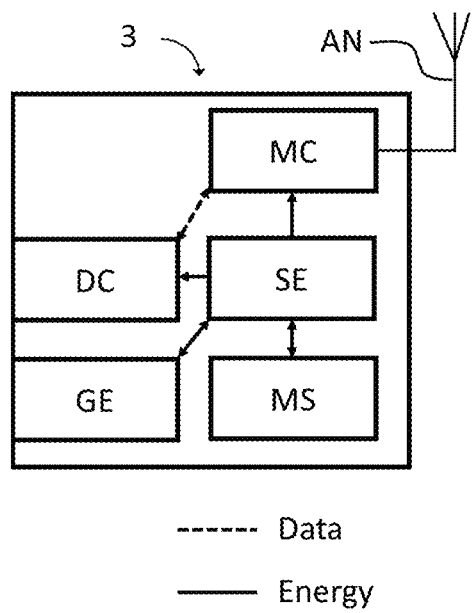
------ Data
—— Energy
[Fig. 6]
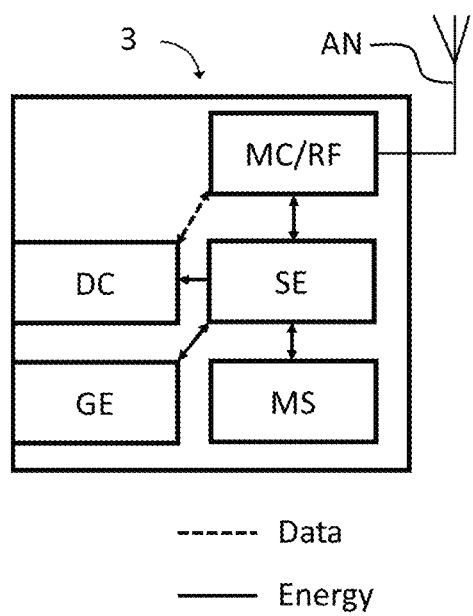
------ Data
—— Energy

[Fig. 7]
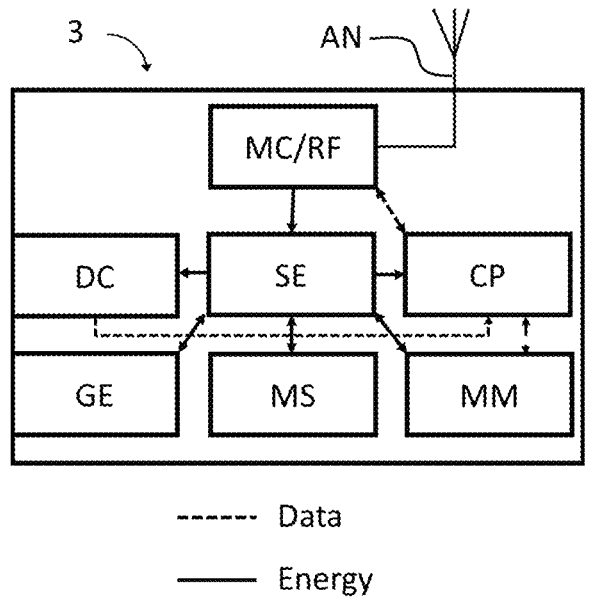
------ Data
——— Energy
[Fig. 8]
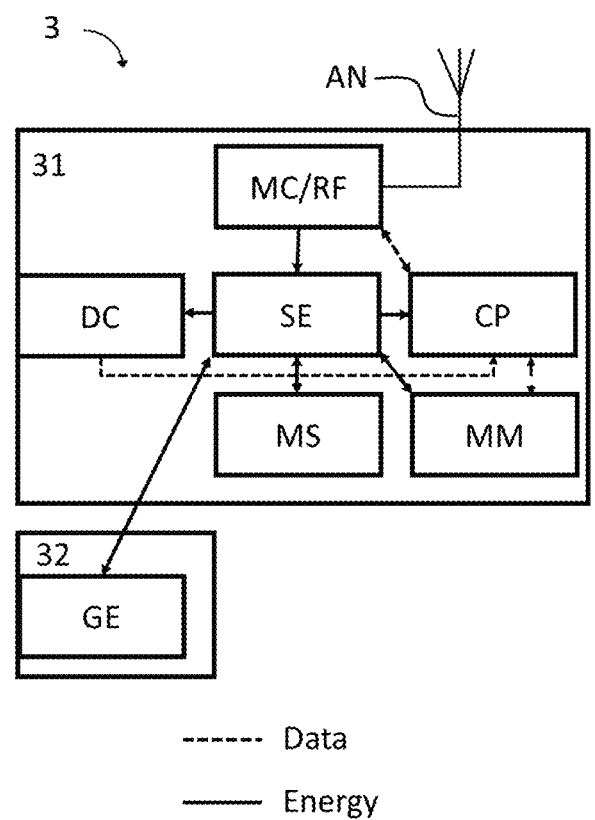
------ Data
——— Energy

[Fig. 9]
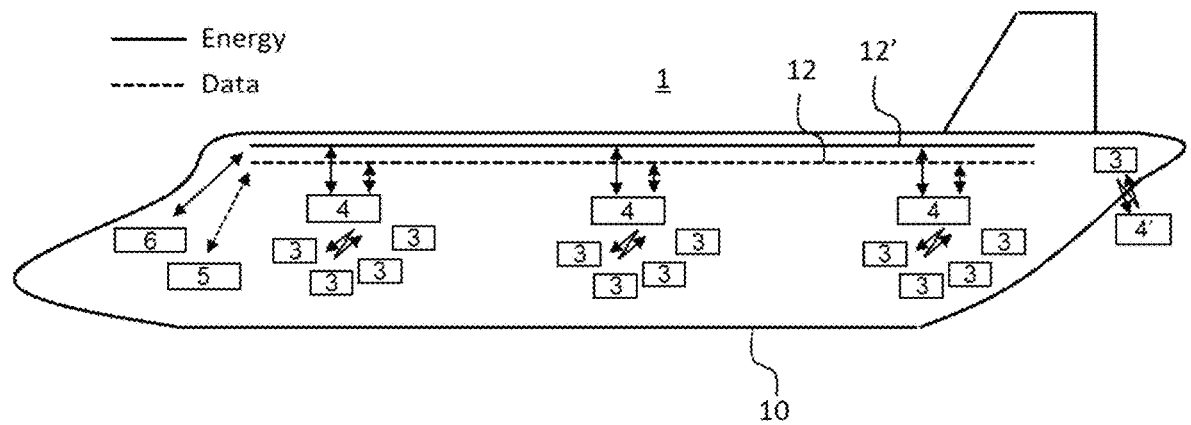
[Fig. 10]
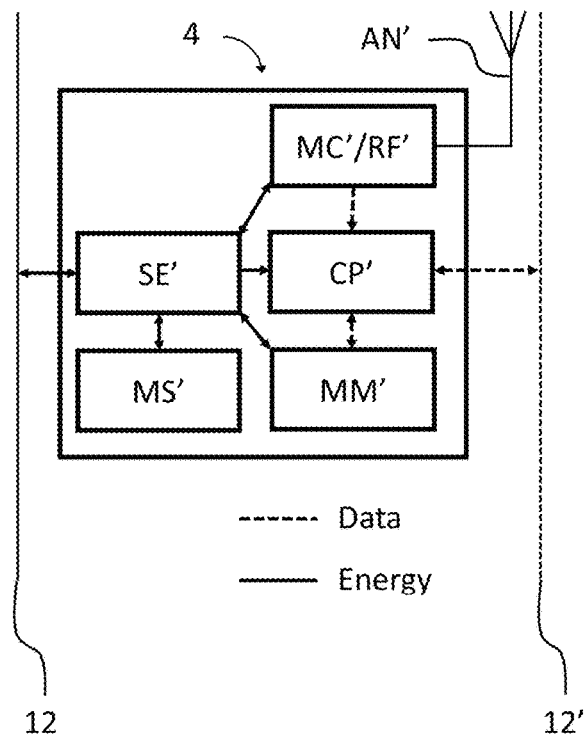

DEVICE FOR DETECTING IMPACTS, ASSOCIATED DETECTION SYSTEM AND AIRCRAFT EQUIPPED WITH SUCH A SYSTEM

CROSS-REFERENCE TO RELATED APPLICATIONS

This application is the U.S. National Stage of PCT/FR2020/052332, filed Dec. 8, 2020, which in turn claims priority to French patent application number 1914168 filed Dec. 11, 2019. The content of these applications are incorporated herein by reference in their entirety.

TECHNICAL FIELD OF THE INVENTION

The technical field of the invention is that of the detection of impacts.

The present invention relates to an impact detection device and in particular an impact detection device configured to operate autonomously thanks to the use of a Seebeck module. The invention also relates to a detection system comprising a plurality of detection devices according to the invention and an aircraft equipped with such a system.

TECHNOLOGICAL BACKGROUND OF THE INVENTION

In a known manner, an aircraft may comprise a fuselage made of composite material or instead a fuselage made of metal material. These two types of fuselages are liable to be damaged during impacts and it is important to be able to detect when such impacts occur. The risk of impacts is particularly important when an aircraft is parked in an airport, vehicles circulating in the airport (tractors, trucks, etc) being liable to enter into contact with the aircraft and damage its fuselage.

In practice, to detect damage linked to an impact, the outer surface of an aircraft is visually inspected by operators, which is long and costly given the fact that the aircraft has to be immobilised. The visual detection of damage linked to an impact is difficult because damage of the composite material is generally internal and not very visible from the exterior. In order to eliminate this drawback, it has been proposed in the patent application FR 3 073 500 to use detection members positioned on the inner face of the fuselage. Each detection member is provided with an impact sensor, a wireless communication means and an energy storage means. The system described in this application does not however enable autonomous implementation. Certainly, it is suggested to collect the energy supplied by the sensor to supply the storage means, but such a solution is in practice difficult to implement, the vibrations having to be situated within a range of frequencies suited to the sensor in order to be able to generate sufficient power.

There thus exists a need for an impact detection device capable of operating autonomously.

SUMMARY OF THE INVENTION

The invention offers a solution to the aforementioned problems, by proposing an impact detection device incorporating a Seebeck module.

A first aspect of the invention relates to an autonomous impact detection device comprising:
  at least one impact detector;
  at least one wireless transmission means configured to transmit the information collected by the impact detector;
  at least one energy storage means configured to supply the impact detector and the wireless transmission means with energy;
  at least one module for harvesting energy by Seebeck effect configured to supply the storage means with energy when a temperature gradient is applied thereto.

Apart from the characteristics that have been mentioned in the preceding paragraph, the system according to a first aspect of the invention may have one or more complementary characteristics among the following, considered individually or according to all technically possible combinations thereof.

Advantageously, the wireless transmission means is also configured to receive energy by radio frequency in order to supply the storage means.

Advantageously, the Seebeck module, hereafter first Seebeck module, is arranged according to a first configuration and the device comprises a second Seebeck module arranged according to a second configuration such that when the device is subjected to a temperature gradient, the voltage generated by the first Seebeck module is of opposite sign to the voltage generated by the second Seebeck module.

Advantageously, the device comprises a supervisor configured to distribute energy to the different components of the device, preferably parameterizable to supply the different components of the device only when a sufficient amount of energy is required to supply the latter.

Advantageously, the device comprises a memory configured to store the measurements made by the impact detector or detectors and a computing means coupled to the memory, the computing means being configured to perform a pre-processing or a processing of the data acquired by the impact detector.

Advantageously, the device comprises a first set comprising the impact detector and a second set comprising the Seebeck module or modules, the first set and the second set being connected such that the energy generated by the Seebeck module at the level of the second set can be transmitted to the first set.

A second aspect of the invention relates to a system for detecting impacts on a structure, the detection system comprising:
  a plurality of detection devices according to a first aspect of the invention positioned on a surface of the structure, each detection device being associated with an identifier relating to a predetermined zone of the structure;
  a plurality of communication devices close to the structure and configured to communicate with the detection devices of the plurality of detection devices so as to collect the measurements made by said devices and to associate them with the identifier of the corresponding device.

Advantageously, each communication device comprises an energy storage means and/or a memory.

A third aspect of the invention relates to an aircraft comprising a fuselage and a detection system according to a second aspect of the invention configured to detect impacts on the fuselage, the detection devices of the impact detection system being arranged on the inner surface of the fuselage and the plurality of communication devices of the impact detection system being arranged in the aircraft.

The invention and the different applications thereof will be better understood on reading the description that follows and by examining the figures that accompany it.

BRIEF DESCRIPTION OF THE FIGURES

FIG. 1 shows a schematic representation of a first embodiment of a device according to a first aspect of the invention.

FIG. 2 shows a schematic representation of the structure of a Seebeck cell.

FIG. 3 shows a schematic representation of a first exemplary embodiment of a Seebeck module of a device according to a first aspect of the invention.

FIG. 4 shows a schematic representation of a first exemplary embodiment of a set of two Seebeck modules of a device according to a first aspect of the invention.

FIG. 5 shows a schematic representation of a second embodiment of a device according to a first aspect of the invention.

FIG. 6 shows a schematic representation of a third embodiment of a device according to a first aspect of the invention.

FIG. 7 shows a schematic representation of a fourth embodiment of a device according to a first aspect of the invention.

FIG. 8 shows a schematic representation of a fifth embodiment of a device according to a first aspect of the invention.

FIG. 9 shows a schematic representation of an aircraft equipped with a detection system according to a second aspect of the invention.

FIG. 10 shows a schematic representation of a communication device of a system according to a second aspect of the invention or of an aircraft according to a third aspect of the invention.

DETAILED DESCRIPTION

The figures are presented for indicative purposes and in no way limit the invention. Unless stated otherwise, a same element appearing in the different figures has a single reference.

A first aspect of the invention illustrated in [FIG. 1] relates to an autonomous impact detection device 3.

The device 3 according to a first aspect of the invention comprises at least one impact detector DC. The impact detector DC may for example be chosen from among an accelerometer or instead a piezoelectric sensor. In one embodiment, the device 3 comprises a plurality of impact detectors DC, the nature of the detectors DC of the plurality of detectors DC being able to be identical or different. Thus, it is possible to put in place a system of redundancy of measurements in order to ensure the exactitude thereof, by choosing for example detectors of same nature. It is also possible to choose detectors of different nature, each type of detector being able to be sensitive to different signals.

The device 3 according to a first aspect of the invention also comprises at least one wireless transmission means MC provided with an antenna AN configured to transmit the information collected by the impact detector or detectors DC. The wireless transmission means MC may for example be an RFID type communication means, a 4G communication means, a Wifi communication means or instead a WAIC (Wireless Avionics Intra-Communications) communication means. The wireless communication means MC make it possible to transmit the data measured by the impact detector or detectors DC rapidly, which presents a certain advantage when the collection of data has to be done regularly and/or on a large number of devices 3 according to a first aspect of the invention. This further guarantees a freedom of implantation of the detection device 3 according to the invention since the latter does not require any physical connection to transmit the measured data.

The device 3 according to a first aspect of the invention also comprises at least one energy storage means MS configured to supply the impact detector DC and the wireless transmission means MC with energy. In one embodiment, the storage means MS is chosen among a battery, a capacitance or instead a supercapacitance.

The device 3 according to a first aspect of the invention also comprises at least one Seebeck module GE. Generally speaking, a Seebeck module GE comprises one or more Seebeck cells CE such as illustrated in FIG. 2 and comprising a first surface S1 intended to be exposed to a first temperature $T_1$ and a second surface S2 intended to be exposed to a second temperature $T_2$. The temperature gradient $\Delta T$ applied to the Seebeck module GE is equal to the difference between the temperature $T_2$ to which the second surface S2 of the Seebeck cell CE is exposed and the temperature $T_1$ to which the first surface S1 of the Seebeck cell CE is exposed such that $\Delta T=T_2-T_1$. The presence of this temperature gradient $\Delta T$ leads to the appearance of a voltage V at the terminals of the Seebeck cell CE, the sign of this voltage V being a function of the sign of the gradient $\Delta T$ applied to the Seebeck cell and the Seebeck coefficient of the materials used. Hereafter, by convention, a positive gradient $\Delta T>0$ will lead to the appearance of a positive voltage $V>0$ and a negative gradient $\Delta T<0$ will lead to the appearance of a negative voltage $V<0$.

An exemplary embodiment of a Seebeck module GE according to the invention is illustrated in FIG. 3 wherein the Seebeck module GE is fixed on the inner surface S1 of a wall 10, for example the fuselage of an airplane, so as to benefit from the temperature difference between an internal temperature $T_{int}$ and an external temperature $T_{ext}$. For example, in the case of an aircraft, a substantial temperature difference exists during flight phases or instead during storage phases in conditions of high external temperatures. More particularly, the Seebeck module GE comprises a Seebeck cell CE comprising a first surface S1 and a second surface S2 and a radiator RA fixed on the second surface S2 of the Seebeck cell. In addition, the radiator RA comprises fins enabling efficient thermalisation of the second surface S2 of the Seebeck cell CE. In this example, the first surface S1 of the Seebeck cell is fixed at the level of the inner surface S1 of a wall 10, for example the inner surface of the fuselage of an aircraft. This fixation is preferentially carried out using an adhesive AD which is a good heat conductor so as to ensure good thermalisation of the first surface S1 of the Seebeck cell in contact with the inner surface of the wall 10. In this configuration, the temperature gradient $\Delta T$ applied to the Seebeck module is thus equal to the difference between the temperature $T_2$ of the second face S2 of the Seebeck cell CE and the temperature $T_1$ of the first face S1 of the Seebeck cell CE. For example, if the wall 10 is the fuselage of an aircraft, during the flight phase, the temperature $T_1$ of the first surface is generally comprised between −20° C. and −30° C., or even in extreme cases −50° C. to −60° C., whereas the temperature $T_2$ of the second surface is in general equal to 0° C. due to the presence of the radiator. Thus, during the flight phase, the temperature gradient $\Delta T$ applied to the Seebeck module is thus generally comprised between 20° C. and 60° C. Given these temperature ranges and a power requirement of the order of several tens of mW, a Seebeck cell CE of several tens of millimetres, for example 40×40 mm, may be sufficient. As an example, the table below illustrates the charging times of a storage means MS (the left column representing the capacitance of the storage means in Farads noted C(F)) as a function of time and the temperature gradient ΔT applied to a Seebeck module.

TABLE 1

| C (F) | ΔT (° C.) | | | | | | | |
|---|---|---|---|---|---|---|---|---|
| | 5 | 10 | 15 | 20 | 25 | 30 | 40 | 50 |
| 0.5 | 31 min | 7 min | 3 min | 104 s | 64 s | 43 s | 22 s | 13 s |
| 1 | 62 min | 15 min | 6 min | 3 min | 2 min | 85 s | 44 s | 26 s |
| 2 | 125 min | 30 min | 13 min | 7 min | 4 min | 3 min | 89 s | 52 s |
| 3 | 187 min | 45 min | 19 min | 10 min | 6 min | 4 min | 2 min | 78 s |

In one embodiment illustrated in FIG. 4, the device according to a first aspect of the invention comprises a second Seebeck module GE2 configured in an inversed manner compared to the Seebeck module described previously, hereafter first Seebeck module GE1. In other words, given that a Seebeck cell CE comprises a first surface S1 and a second surface S2, when the device 3 according to a first aspect of the invention is fixed to a surface, the Seebeck cell CE of the first Seebeck module GE1 is in contact with this surface 10 through its first surface S1 whereas the Seebeck cell CE of the second Seebeck module GE2 is in contact with said surface 10 through its second surface S2. In other words, in the example illustrated in FIG. 4 and for the second Seebeck module GE2, the radiator RA is fixed on the first surface S1 of the Seebeck cell CE and the second surface S2 of the Seebeck cell CE is fixed at the level of the inner surface of the wall 10. In this embodiment, the device 3 according to a first aspect of the invention is thus able to produce a positive (or negative) voltage whatever the sign of the temperature gradient ΔT between the internal temperature $T_{int}$ and the external temperature $T_{ext}$. In FIG. 4, the dashed arrow indicates, for each Seebeck cell CE, the sense of the temperature gradient required to obtain a positive voltage V at the terminals of the corresponding Seebeck module.

In one embodiment illustrated in FIG. 5, the device 1 according to a first aspect of the invention comprises an energy supervisor SE configured to distribute energy to the different components of the device 3 according to a first aspect of the invention.

In one embodiment illustrated in FIG. 6, the wireless transmission means MC/RF are also configured to receive energy by radio frequency. Thus, when the Seebeck module GE has not enabled a sufficient charge of the storage means MS, the latter may be recharged remotely and/or the different components of the device 3 may be supplied with energy. Thus, the wireless transmission means MC/RF represent a complementary means for supplying the Seebeck module GE with energy. Indeed, when the temperature gradient is not sufficient and when the Seebeck module GE thus cannot supply the device 3 according to a first aspect of the invention, the wireless transmission means MC/RF may be used as a substitute for the Seebeck module GE. It will be noted that this is particularly advantageous in the case of an aircraft 1 since small gradients are generally observed when the aircraft 1 is on the ground. Yet, it is precisely when the aircraft 1 is parked on the ground that security measures allow the transmission of radio frequencies capable of supplying the necessary energy to the device 3.

In one embodiment illustrated in FIG. 7, the device 3 according to a first aspect of the invention comprises a memory MM configured to store the measurements made by the impact detector or detectors DC. Thus, the measurements made by the device 3 are not necessarily transmitted immediately, but only at regular intervals. In this embodiment, the device 3 according to a first aspect of the invention also comprises a computing means CP coupled to the memory MM, said computing means CP being configured to perform a pre-processing or a processing of the data acquired by the impact detector or detectors DC. For example, the pre-processing or the processing will be able to comprise the selection of acquired data which have to be memorized in the memory MM and/or transmitted by the wireless communication means MC.

In one embodiment illustrated in FIG. 8, the device 3 according to a first aspect of the invention comprises a first set 31, for example in the form of a first housing, comprising the impact detector or detectors DC, and a second set 32, for example in the form of a second housing, comprising the Seebeck module or modules GE, the first set 31 and the second set 32 being connected such that the energy generated by the Seebeck module GE at the level of the second set 32 can be transmitted to the first set 31. Thus, it is possible to displace the Seebeck module or modules when the most suitable location for the detection of impacts and the most suitable location for the generation of energy by the Seebeck module GE are not identical.

A second aspect of the invention relates to a system for detecting impacts on a structure, the detection system comprising a plurality of autonomous detection devices 3 according to a first aspect of the invention positioned on a surface S1 of the structure, each detection device 3 being associated with an identifier relating to a predetermined zone of the structure; and a plurality of communication devices close to the structure and configured to communicate with the detection devices 3 of the plurality of detection devices 3 so as to collect the measurements made by said devices 3 and to associate them with the identifier of the corresponding device 3.

In the remainder of the description, the system according to a second aspect of the invention is going to be illustrated through an application wherein the structure to monitor is the fuselage of an aircraft. Those skilled in the art will understand that such a system may be used in other situations. Consequently, a third aspect of the invention illustrated in FIG. 9 relates to an aircraft 1 comprising a fuselage 10 and an impact detection system according to a second aspect of the invention. The detection system comprises a plurality of autonomous detection devices 3 according to a first aspect of the invention positioned on an inner surface S1 of the fuselage 10 of the aircraft 1. Further, each autonomous detection device 3 is associated with an identifier relating to a predetermined fuselage zone 10, such that it is possible, knowing the identifier of the device 3 having detected an impact, to know the zone in which the impact has occurred.

In one embodiment, the detection devices 3 are fixed on the inner surface S1 of the fuselage 10 using an adhesive. The use of an adhesive enables an easy positioning and repositioning of the detection devices 3. In addition, such a fixation means reduces the risks of damaging the fuselage 10 during the fixation of said detection devices 3.

The aircraft 1 according to a third aspect of the invention also comprises a plurality of communication devices 4 arranged in the aircraft 1 and configured to communicate with the detection devices 3 of the plurality of detection devices 3 so as to collect the measurements made by said devices 3 and to associate them with the identifier of the corresponding device 3. Preferably, the plurality of communication devices 4 are positioned so as to be able to communicate with all of the detection devices 3 of the plurality of detection devices 3. It is important to note that a communication device 4 will be able to communicate with one or more detection devices 3. It is also important to note that one or more detection devices 3 may be positioned so as not to be able to communicate with any of the communication devices 4. The latter will however be able to be interrogated using a portable communication device 4', for example during control or maintenance operations.

In one embodiment, the communication devices 4 are supplied by an electrical supply network 12' connecting the different communication devices 4 to the electrical supply of the aircraft 1. The energy thus received may then be transmitted to each detection device 3 through the means for receiving energy by radio frequency RF. To do so, each communication device 4 comprises a wireless communication means MC'/RF' configured to operate as wireless communication means or as means for sending energy by radio frequency to the detection devices 3. Assuming a communication device 4 having an antenna AN' of gain equal to 3 dBi and a loss due to the cable of 4.4 dB, and an autonomous detection device 3 having an antenna AN having a gain equal to 4.5 dBi, table 2 below illustrates the power transmitted (in dBm and in W) and the power received at the level of a detection device 3 (in dBm and in mVV) as a function of the distance separating the considered communication device 4 from the considered detection device 3.

TABLE 2

| Distance | Power transmitted (dBm) | Power transmitted (W) | Power received (dBm) | Power received (mW) |
|---|---|---|---|---|
| 1 m | 33 | 2 | 4.9 | 3.1 |
| 3 m | 33 | 2 | −4.6 | 0.34 |
| 5 m | 33 | 2 | −9.1 | 0.12 |
| 10 m | 33 | 2 | −15.1 | 0.031 |

Those skilled in the art will thus ensure to take this information into account during the positioning of the communication devices 4 and/or the positioning of the detection devices 3, while obviously adapting the hypotheses made above.

In one embodiment illustrated in FIG. 10, each communication device 4 comprises an energy storage means MS', for example a battery, configured to supply the communication device 4 when the electrical supply network 12' no longer supplies energy. This is notably the case when the aircraft 1 is parked for a long period. Thus, even without external electrical supply, the communication devices 4 of the aircraft 1 can continue to interrogate the detection devices 3, or even to supply the detection devices 3 by radio frequency if necessary. In one embodiment, the communication device 4 also comprises an energy supervisor SE' in charge of the management of the energy of the communication device 4, and in particular of the energy storage means MS'.

In the same way, the communication devices 4 are connected to a communication network 12 and the data collected from the detection devices 3 by the communication devices 4 may be transmitted on the communication network 12 to next be processed, for example by an on-board computer 5 or instead by a centralised maintenance server. In one embodiment, each communication device 4 comprises a memory MM' (e.g. a hard disc), the data collected from the detection devices 3 being stored in the memory MM' when the electrical supply network 12' no longer supplies energy, then transmitted on the communication network when the electrical supply network 12' again supplies energy. In one embodiment, the communication device 4 comprises a computing means CP' (for example a processor) making it possible to process the data stored in the memory MM'.

In one embodiment, the fuselage 10 is a composite fuselage. Indeed, composite fuselage damage is particularly difficult to detect by visual inspection and a detection system such as described in the second aspect of the invention makes this detection much more reliable. It follows however from the above that the invention may be implemented on any type of fuselage (made of composite materials, metal materials, etc.).

The invention claimed is:

1. An autonomous impact detection device comprising:
   at least one impact detector;
   at least one wireless transmission device configured to transmit information collected by the impact detector;
   at least one energy storage device configured to supply the impact detector and the wireless transmission device with energy;
   a first Seebeck module configured to supply the energy storage device with energy when a temperature gradient is applied thereto, and
   a second Seebeck module configured to supply the energy storage device with energy when a temperature gradient is applied thereto, wherein the first Seebeck module is arranged according to a first configuration and wherein the second Seebeck module is arranged according to a second configuration such that, when the autonomous impact detection device is subjected to a temperature gradient, a voltage generated by the first Seebeck module is of opposite sign to a voltage generated by the second Seebeck module.

2. The autonomous impact detection device according to claim 1, wherein the wireless transmission device is also configured to receive energy by radio frequency in order to supply the energy storage device.

3. The autonomous impact detection device according to claim 1, comprising a supervisor configured to distribute energy to different components of the autonomous impact detection device.

4. The autonomous impact detection device according to claim 1, comprising a memory configured to store measurements made by the impact detector or detectors and a computing system coupled to the memory, the computing system being configured to perform a pre-processing or a processing of the data acquired by the impact detector.

5. The autonomous impact detection device according to claim 1, comprising a first set comprising the impact detector and a second set comprising at least one Seebeck module selected from the group consisting of the first Seebeck module and the second Seebeck module, the first set and the second set being connected such that the energy generated by the at least one Seebeck module of the second set can be transmitted to the first set.

6. An impact detection system for detecting impacts on a structure, the detection system comprising:
   a plurality of autonomous impact detection devices according to claim 1 positioned on a surface of the structure, each detection device being associated with an identifier relating to a predetermined zone of the structure;
   a plurality of communication devices close to the structure and configured to communicate with the autonomous impact detection devices so as to collect measurements made by said autonomous impact detection devices and to associate the measurements with the identifier of the corresponding device.

7. The impact detection system according to claim 6, wherein each communication device comprises an energy storage device and/or a memory.

8. An aircraft comprising a fuselage and a detection system according to claim 6 configured to detect impacts on the fuselage, the autonomous impact detection devices of the impact detection system being arranged on an inner surface of the fuselage and the plurality of communication devices of the impact detection system being arranged in the aircraft.

* * * * *